United States Patent
Nakajima (10) Patent No.: US 7,312,741 B2
(45) Date of Patent: Dec. 25, 2007

(54) ANALOG-TO-DIGITAL CONVERTER CIRCUIT AND REFERENCE CIRCUIT

(75) Inventor: Yuji Nakajima, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/403,845

(22) Filed: Apr. 14, 2006

(65) Prior Publication Data

US 2006/0232462 A1    Oct. 19, 2006

(30) Foreign Application Priority Data

Apr. 19, 2005    (JP)    ............................. 2005-121415

(51) Int. Cl.
*H03M 1/34* (2006.01)
(52) U.S. Cl. ...................... 341/158; 341/154; 341/155
(58) Field of Classification Search ................ 341/154, 341/155, 159, 144, 145, 136, 158
See application file for complete search history.

(56) References Cited

U.S. PATENT DOCUMENTS

| | | | | |
|---|---|---|---|---|
| 3,997,892 A * | 12/1976 | Susset | .......................... | 341/136 |
| 5,585,796 A * | 12/1996 | Svensson et al. | ............ | 341/155 |
| 5,703,588 A * | 12/1997 | Rivoir et al. | ................ | 341/159 |
| 6,201,491 B1 * | 3/2001 | Brunolli et al. | ............. | 341/144 |
| 6,288,664 B1 * | 9/2001 | Swanson | ..................... | 341/155 |
| 6,384,763 B1 * | 5/2002 | Leung et al. | ................ | 341/154 |

(Continued)

FOREIGN PATENT DOCUMENTS

JP    63-31625    1/1988

(Continued)

OTHER PUBLICATIONS

"A Duel-mode 700-Msamples/s 6-bit 200-Msamples/s 7-bit A/D Converter in a Converter in a 0.25-um Digital CMOS Process", IEEE Journal of Solid State Circuits, vol. 35, No. 12, Dec. 2000, pp. 1760-1768.

*Primary Examiner*—Jean Bruner Jeanglaude
(74) *Attorney, Agent, or Firm*—McGinn IP Law Group, PLLC (57) ABSTRACT

Disclosed is an analog-to-digital converter circuit that includes a reference circuit for applying reference voltages to comparators that compare the reference voltages with the output of the buffer circuit. The reference circuit includes a first voltage-dividing resistor circuit, which is connected between first and second voltage supply terminals, for supplying the reference voltages to the comparators; a second voltage-dividing resistor circuit connected between the first and second voltage supply terminals in parallel with the first voltage-dividing resistor circuit; first and second buffers having their input ends connected to respective ones of first and second taps of the second voltage-dividing resistor circuit; a first amplifier for receiving and differentially amplifying the output at a first end of the first voltage-dividing resistor circuit and the output of the first buffer; a second amplifier for receiving and differentially amplifying the output at a second end of the first voltage-dividing resistor circuit and the output of the second buffer; a transistor, which is connected between the first voltage supply terminal and the first end of the first voltage-dividing resistor circuit and which has its gate connected to the output of the first amplifier; and a transistor, which is connected between the second voltage supply terminal and the second end of the first voltage-dividing resistor circuit and which has its gate connected to the output of the second amplifier. Reference voltages are supplied to corresponding comparators from the first and second ends of the first voltage-dividing resistor circuit and from taps of resistors connected between said first and second ends.

13 Claims, 8 Drawing Sheets

U.S. PATENT DOCUMENTS

6,448,917 B1 * 9/2002 Leung et al. ................ 341/144
7,136,002 B2 * 11/2006 Dempsey et al. ........... 341/145

FOREIGN PATENT DOCUMENTS

JP            9-116435           5/1997

* cited by examiner

ANALOG-TO-DIGITAL CONVERTER CIRCUIT AND REFERENCE CIRCUIT

FIELD OF THE INVENTION

This invention relates to an analog-to-digital conversion technique. More particularly, the invention relates to a reference circuit for generating a reference voltage applied to a comparator, and to an analog-to-digital converter circuit equipped with this reference circuit.

BACKGROUND OF THE INVENTION

Figure 1:
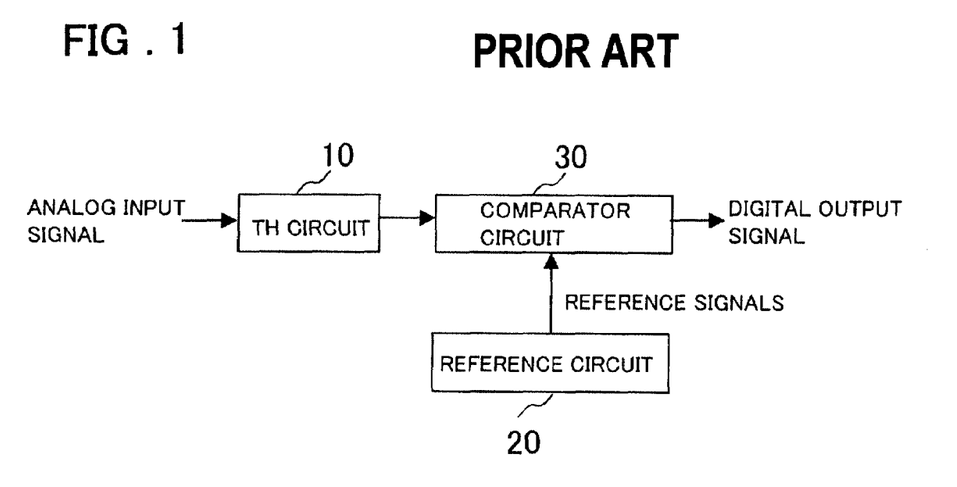
FIG. 1 is a diagram illustrating the structure of an A/D converter circuit according to an embodiment of the present invention.
Figure 2:
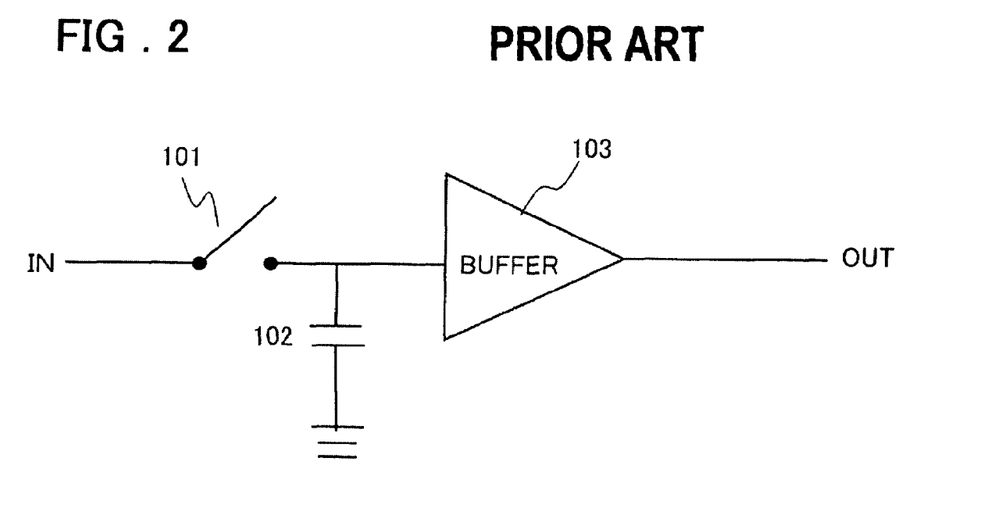
FIG. 2 is a diagram illustrating the structure of a track-and-hold circuit in FIG. 1.

A flash-type analog-to-digital converter circuit (referred to as an "A/D converter circuit") includes a plurality of comparators (voltage comparators) that receive an analog input signal in parallel, a reference circuit for supplying the plurality of comparators with respective ones of reference voltages having levels that differ from one another, and an encoder for receiving the results of the comparison operations that are output from the plurality of comparators, encoding these signals and producing a digital output signal (see FIG. 1). Flash A/D converter circuits are used generally for high-speed applications and require a track-and-hold circuit (TH circuit) (10 in FIG. 1) for sampling of the input analog signal. A/D converter circuits having an on-chip TH circuit also are available on the market. As shown in FIG. 2, a TH circuit typically is equipped with a switch 101, a capacitor 102 and a buffer 103. When the switch 101 is closed, an input analog signal from an input terminal (IN) is sampled. When the switch 101 is opened, a voltage (the terminal voltage of the capacitor 102), which has accumulated in the capacitor 102, is output from the buffer output (OUT).

The reference circuit (20 in FIG. 1) generates n (where n is $2^m$, and m is a prescribed integer) reference voltages and supplies these to reference-voltage (reference-voltage) input terminals of respective ones of n comparators. As shown for example in FIG. 8, the reference circuit typically includes a voltage-dividing resistor circuit comprising resistors R1 to Rn connected in series between a reference top potential (VRT, which is the highest potential among the reference voltages) and a reference bottom potential (VRB, which is the lowest potential among the reference voltages). The top and bottom potentials VRT and VRB, respectively, and the reference voltages between them are extracted from taps (the connection terminals of the resistors R1 to Rn) and are supplied to the corresponding comparators.

Figure 8:
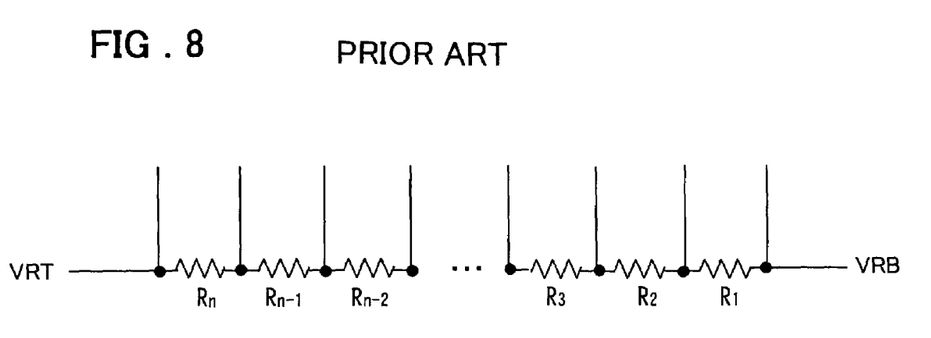
FIG. 8 is a diagram illustrating the structure of a reference circuit according to the prior art.

By way of example, Patent Document 1 discloses a variable reference level generating circuit of a flash-type A/D converter circuit. In the disclosed A/D converter circuit, an input signal is supplied to a plurality of comparators provided in parallel, the comparators are supplied with respective ones of reference voltages the levels of which differ from one another, and the outputs of the comparators are encoded. The input signal is supplied via a sample-and-hold circuit, and a circuit that forms the reference voltages also is provided with sample-and-hold circuits having characteristics identical with those of the circuit to which the input signal is applied. This arrangement is such that sample-and-hold circuits (the sample-and-hold operation of which is controlled by the sampling pulses) are connected to respective ones of a reference top potential supply terminal and reference bottom potential supply terminal, a voltage-dividing resistor circuit is provided between outputs of these two sample-and-hold circuits and the reference voltages are supplied to corresponding comparators from the taps of the resistor circuit. The voltage-dividing resistor circuit is constructed as shown in FIG. 8. In this specification, the track-and-hold circuit (TH circuit) that samples and holds the input signal is essentially synonymous with a sample-and-hold circuit (SH circuit) that samples and holds an input signal.

Non-Patent Reference 1 discloses an arrangement in which a reference circuit (reference voltage generator) that generates reference voltages for a comparator array applies a common-mode reference voltage Vcmi to a sample-and-hold circuit (SHREF) comprising a replica circuit of a main sample-and-hold circuit (main S/H circuit), and a reference top potential Vrefp {=Vcmr+[(Iref)(R2)/2], where Iref represents a reference current that has been generated from a band-gap reference voltage} applied to one end of a voltage-dividing resistor circuit is generated by an amplifier (A2), which receives an output Vcmr of the sample-and-hold circuit (SHREF) at a non-inverting input terminal, and a feedback resistor (R2, this being connected between an inverting input terminal and output terminal of the amplifier A2). A constant-current source is connected to one end of the voltage-dividing resistor circuit in the reference circuit of Non-Patent Reference 1.

Further, Patent Reference 2 discloses an arrangement in which a voltage-dividing resistor circuit is constructed by providing a transistor forming a first variable resistor, a fixed resistor and a transistor forming a second variable resistor between a power-supply potential VDD and ground potential GND. Nodes of the variable resistors and fixed resistor are connected to first and second voltage followers, the output voltages of the first and second voltage followers are sent to an A/D converter as reference voltages, and reference voltages are supplied to comparators from the taps of a resistor array (voltage-dividing resistor circuit) connected across the output voltages of the first and second voltage followers.

[Patent Document 1]

Japanese Utility Model Kokai Publication No. 63-31625 (FIG. 1)

[Patent Document 2]

JP Patent Kokai Publication No. JP-A-9-116435 (FIG. 1)

[Non-Patent Document 1]

Krishnaswamy Nagaraj, David A Martin, Mark Wolf, Ranjan Chattopadhyay, Shanthi Pavan, Jason Cancio, and T. R. Viswanathan, "A Dual-Mode 700-Msamples/s 6-bit 200-Msamples/s 7-bit A/D Converter in a 0.25-µm Digital CMOS Process," IEEE JOURNAL OF SOLID STATE CIRCUITS, VOL. 35, NO. 12, pp. 1760 to 1768, DECEMBER 2000, (FIG. 15)

A buffer circuit used in a track-and-hold circuit of a high-speed A/D converter circuit requires a wide band, and hence there are such cases where it is difficult to achieve a desired high gain in terms of a given GB (Gain Bandwidth) product. For this reason, gain error tends to occur in a track-and-hold circuit that includes a buffer circuit.

Further, an offset error is produced in a case where a source follower is used in a buffer circuit employed in a track-and-hold circuit.

Gain error and offset error in a buffer circuit that supplies an input signal to a comparator cause gain error and the like in an A/D converter circuit. These errors vary depending upon the process, power-supply voltage and temperature, etc. This in turn leads to a variance in conversion precision and degradation of DC, AC (dynamic) characteristics or the like.

SUMMARY OF THE DISCLOSURE

The present invention, for solving the above-mentioned problems that arise in the prior art, has the configuration as follows:

An analog-to-digital converter circuit according to one aspect of the present invention, comprises: a buffer circuit for receiving an input signal; a comparator for comparing an output signal from the buffer circuit with reference voltages; and a reference circuit for applying the reference voltages to the comparator; the reference circuit having a replica buffer circuit that exhibits a predetermined characteristic corresponding to that of the buffer circuit, the replica buffer circuit outputting a reference voltage relating to at least one of a top voltage and bottom voltage of reference voltages that are output from the reference circuit, and a control circuit for exercising control so as to reduce an error between at least one of the top voltage and bottom voltage of reference voltages, which are actually output from the reference circuit, and output voltage of the replica buffer circuit.

In accordance with the present invention, the reference circuit that applies the reference voltages to a comparator that compares the output voltage of a track-and-hold circuit, which receives an input analog signal, with the reference voltages has a replica buffer circuit the characteristic of which corresponds to that of a buffer circuit of the track-and-hold circuit. The reference voltages are supplied based upon the output of the replica buffer circuit.

According to another aspect of the present invention, there is provided an analog-to-digital converter circuit comprising: a buffer circuit for receiving an input signal; a comparator for comparing an output signal from the buffer circuit with reference voltages; and a reference circuit for applying the reference voltages to the comparator, the reference circuit having first and second voltage-dividing resistor circuits arranged in parallel between first and second voltage supply terminals, reference voltages having levels that differ from one another being extracted from taps of the first voltage-dividing resistor circuit, and a control circuit, which receives as an input from a prescribed tap of the second voltage-dividing resistor circuit a reference voltage corresponding to at least one of a top voltage and bottom voltage of reference voltages that are output from the reference circuit, for exercising control in such a manner that at least one voltage of a voltage at one end and voltage at the other end of the first voltage-dividing resistor circuit will be equal to the reference voltage.

In the present invention, the control circuit of the reference circuit has a current source which has its current variably controlled, between the first voltage supply terminal and one end of the first voltage-dividing resistor circuit and/or between the second voltage supply terminal and the other end of the first voltage-dividing resistor circuit.

In the present invention, the control circuit of the reference circuit includes a replica buffer circuit that exhibits a predetermined characteristic corresponding to that of the buffer circuit, and an amplifier circuit; the replica buffer circuit receiving as an input from a prescribed tap of the second voltage-dividing resistor circuit a reference voltage corresponding to at least one of a top voltage and bottom voltage of reference voltages that are output from the reference circuit; and the amplifier circuit outputting a signal, which variably controls a current value of the current source, based upon an output voltage of the replica buffer circuit and at least one voltage of a voltage at one end and a voltage at the other end of the first voltage-dividing resistor circuit, in such a manner that at least one voltage of the voltage at one end and the voltage at the other end of the first voltage-dividing resistor circuit will be equal to the reference voltage.

In the present invention, the replica buffer circuit has a DC characteristic that corresponds to that of the buffer circuit.

In the present invention, the replica buffer circuit has a gain error and/or offset error that corresponds to that of the buffer circuit.

In the present invention, the replica buffer circuit is adapted to have a size smaller than that of the buffer circuit.

In the present invention, the buffer circuit is a buffer circuit in a track-and-hold circuit, and a plurality of the comparators are provided for receiving a signal from the buffer circuit in parallel; the plurality of comparators being supplied with respective ones of corresponding reference voltages from the reference circuit.

A reference circuit according to another aspect of the present invention, comprises: first and second voltage-dividing resistor circuits arranged in parallel between first and second voltage supply terminals; a first buffer having an input end connected to a first tap of the second voltage-dividing resistor circuit; a second buffer having an input end connected to a second tap of the second voltage-dividing resistor circuit; a first amplifier for receiving and differentially amplifying a voltage at one end of the first voltage-dividing resistor circuit and output voltage of the first buffer; a second amplifier for receiving and differentially amplifying a voltage at the other end of the first voltage-dividing resistor circuit and output voltage of the second buffer; a first transistor connected between the first voltage supply terminal and one end of the first voltage-dividing resistor circuit and having a control terminal connected to an output of the first amplifier; and a second transistor connected between the second voltage supply terminal and the other end of the first voltage-dividing resistor circuit and having a control terminal connected to an output of the second amplifier; the first and second buffers each constructing the replica buffer circuit, and reference voltages being extracted from the one end and other end of the first voltage-dividing resistor circuit and from at least one tap among taps of resistors connected between this one end and other end of the first voltage-dividing resistor circuit.

The meritorious effects of the present invention are summarized as follows.

The present invention realizes a reference circuit that supplies high-precision reference voltages to a comparator that compares the reference voltages with the output voltage of a buffer circuit that receives an input analog signal. Further, the present invention is such that in the comparator to which the output voltage of the buffer circuit and the reference voltages are input, gain error and offset error in the buffer circuit are cancelled out by the reference voltages from the reference circuit, the influence of gain error and offset error in the buffer circuit is suppressed and error in an A/D converter circuit can be reduced.

Other features and advantages of the present invention will be apparent from the following description taken in conjunction with the accompanying drawings, in which like reference characters designate the same or similar parts throughout the figures thereof.

PREFERRED EMBODIMENTS OF THE INVENTION

A preferred embodiment of the present invention will now be described in detail with reference to the accompanying drawings. In the present invention, a reference circuit applies reference voltages to a comparator that compares the reference voltages with an output voltage of a track-and-hold circuit (buffer circuit) that receives an input analog signal. The reference circuit includes a replica buffer circuit that exhibits a predetermined characteristic corresponding to that of the buffer circuit. The replica buffer circuit outputs a reference voltage relating to at least one of a top voltage and bottom voltage of reference voltages that are output by the reference circuit. The reference circuit has control means for exercising control so as to reduce an error between at least one of the top voltage and bottom voltage of reference voltages, which are actually output from the reference circuit, and the output voltage of the replica buffer circuit. Gain error and offset error are reduced and the accuracy of a high-speed A/D converter circuit is improved.

Figure 3:
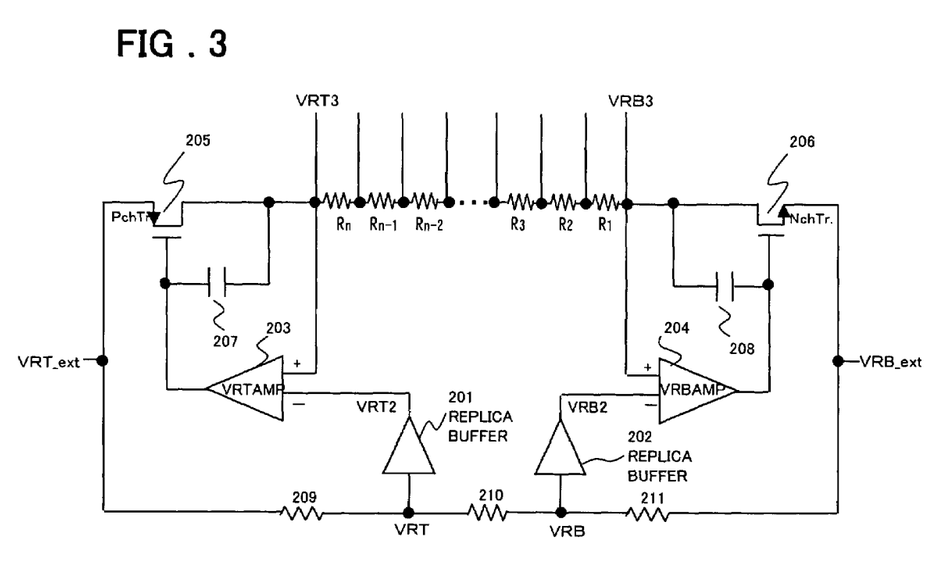
FIG. 3 is a diagram illustrating the structure of a reference circuit in FIG. 1.

An embodiment of the reference circuit according to the present invention will be described with reference to FIG. 3. As shown in FIG. 3, the reference circuit includes a first voltage-dividing resistor circuit (R1 to Rn) and a second voltage-dividing resistor circuit (209, 210 and 211) connected in parallel between first and second voltage supply terminals (VRText and VRBext). Reference voltages having levels that differ from one another are extracted from respective ones of taps of the first voltage-dividing resistor circuit (R1 to Rn). The reference circuit further includes a control circuit that receives, as inputs from prescribed taps of the second voltage-dividing resistor circuit (209, 210 and 211), reference voltages (VRT and VRB) corresponding to a top voltage (VRT3) and bottom voltage (VRB3), respectively, of the reference voltages that are output by the reference circuit. Although it does not constitute a particular limitation, the reference circuit further includes at least one current source (205 and/or 206) connected between the first voltage supply terminal (VRText) and one end (VRT3) of the first voltage-dividing resistor circuit (R1 to Rn) and between the second voltage supply terminal (VRBext) and the other end (VRB3) of the first voltage-dividing resistor circuit (R1 to Rn). The current source is such that the current thereof is capable of being variably controlled. The reference circuit further includes replica buffer circuits (201 and 202) having a predetermined characteristic that corresponds to that of a buffer circuit, and amplifier circuits (203 and 204). The replica buffer circuits (201 and 202) receive, as inputs from prescribed taps of the second voltage-dividing resistor circuit (209, 210 and 211), the reference voltages (VRT and VRB) corresponding to the top voltage and bottom voltage, respectively, of the reference voltages that are output by the reference circuit. Based upon output voltages (VRT2 and VRB2) of the replica buffer circuits (201 and 202), respectively, and the voltages (VRT3 and VRB3) at one end and at the other end of the first voltage-dividing resistor circuit (R1 to Rn), the amplifier circuits (203 and 204) output signals that variably control the current value(s) of the current source(s) (205 and/or 206) in such a manner that the voltages at the one end and at the other end of the first voltage-dividing resistor circuit (R1 to Rn) will be equal to reference voltages (VRT and VRB), respectively. It should be noted that this reference circuit is applicable not only to an A/D converter circuit but to also to various applications as a high-precision reference circuit for generating a plurality of reference voltages.

In the present invention, the replica buffer circuits (201 and 202) have a DC characteristic that corresponds to that of the buffer circuit to which the input analog signal is input. Preferably, the replica buffer circuits (201 and 202) have a gain error and/or offset error that corresponds to that of the buffer circuit. The replica buffer circuits (201 and 202) need only have a DC characteristic corresponding to that of the buffer circuit to which the input analog signal is input and which requires a high band and high gain. That is, it is not needed that replica buffer circuits (201 and 202) have the same AC characteristic as that of the buffer circuit to which the input analog signal is input. For this reason the replica buffer circuits (201 and 202) may have a size smaller than that of the buffer circuit to which the input analog signal is applied.

The present invention will now be described with regard to an embodiment of a flash-type A/D converter circuit.

FIG. 1 is a diagram illustrating the configuration of an A/D converter circuit according to an embodiment of the present invention. As shown in FIG. 1, the A/D converter circuit includes a track-and-hold circuit 10, a reference circuit 20 and a comparator circuit 30. It should be noted that the comparator circuit 30 has a plurality of comparators (not shown) that receive the output of the track-and-hold circuit 10 in parallel, and that the reference circuit 20 applies reference signals (reference voltages) corresponding to the plurality of comparators in the comparator circuit 30.

As shown in FIG. 2, the track-and-hold circuit 10 includes a switch 101, a capacitor 102 and a buffer circuit 103. When the switch 101 is closed, the input signal is sampled in the capacitor 102. When the switch 101 is opened, the terminal voltage of the capacitor 102 is output from the buffer 103.

FIG. 3 is a diagram illustrating the structure of a reference circuit 20 in FIG. 1. As shown in FIG. 3, a plurality of resistors (R1 to Rn), which are connected in series between an external reference top voltage supply terminal VRText and an external reference bottom voltage supply terminal VRBext, compose a first voltage-dividing resistor circuit. The voltages at the taps of the first voltage-dividing resistor circuit are supplied to the corresponding comparators as reference voltages for the purpose of comparison.

Resistors 209, 210 and 211 are connected in series between the external reference top voltage supply terminal VRText and external reference bottom voltage supply terminal VRBext and compose a second voltage-dividing resistor circuit.

The reference circuit further includes a buffer 201 whose input is connected to the node of the second voltage-dividing resistor circuit (209, 210 and 211) that applies the reference top voltage VRT, and a differential amplifier 203 whose inverting and non-inverting input terminals are connected to the output VRT2 of the buffer 201 and one end VRT3 of the first voltage-dividing resistor circuit (R1 to Rn), respectively.

The reference circuit further includes a buffer 202 whose input is connected to the node of the second voltage-dividing resistor circuit (209, 210 and 211) that applies the reference bottom voltage VRB, and a differential amplifier 204 whose inverting and non-inverting input terminals are connected to the output VRB2 of buffer 202 and the other end VRB3 of the first voltage-dividing resistor circuit (R1 to Rn), respectively.

The reference circuit further includes a P-channel MOS transistor 205 having a source connected to the reference top voltage supply terminal VRText, a drain connected to one end VRT3 of the first voltage-dividing resistor circuit (R1 to Rn) and a gate connected to the output end of the differential amplifier 203. A capacitor 207 for phase compensation is inserted between the drain and gate of the P-channel MOS transistor 205.

The reference circuit further includes an N-channel MOS transistor 206 having a source connected to the reference bottom voltage supply terminal VRBext, a drain connected to the other end VRB3 of the first voltage-dividing resistor circuit (R1 to Rn) and a gate connected to the output end of the differential amplifier 204. A capacitor 208 for phase compensation is inserted between the drain and gate of the N-channel MOS transistor 206.

The operation of the reference circuit shown in FIG. 3 will now be described. A feedback circuit is composed by the differential amplifier 203, which differentially amplifies the difference voltage (error) between VRT2 and the top voltage VRT3 of reference voltages actually output from the reference circuit, and the P-channel MOS transistor 205 (the source-to-drain current whereof is variably controlled by the gate voltage) that receives the output of the differential amplifier 203. By virtue of this feedback circuit, control is exercised in such a manner that the top voltage VRT3 of reference voltages actually output from the reference circuit will agree with the voltage VRT2. If the top voltage VRT3 of reference voltages actually output from the reference circuit is less than VRT2, then the output voltage of the differential amplifier 203 transitions to a potential lower than the present potential, the source-to-drain current of the P-channel MOS transistor 205 increases owing to a drop in the gate potential of the P-channel MOS transistor 205, the voltage at the drain node of the P-channel MOS transistor 205 rises and VRT3 approaches VRT2. If the top voltage VRT3 of reference voltages actually output from the reference circuit is greater than VRT2, then the output voltage of the differential amplifier 203 transitions to a potential higher than the present potential, the source-to-drain current of the P-channel MOS transistor 205 decreases owing to a rise in the gate potential of the P-channel MOS transistor 205, the voltage at the drain node of the P-channel MOS transistor 205 declines and VRT3 approaches VRT2.

Another feedback circuit is composed by the differential amplifier 204, which differentially amplifies the difference voltage (error) between VRB2 and the bottom voltage VRB3 of reference voltages actually output from the reference circuit, and the N-channel MOS transistor 206 (the source-to-drain current whereof is variably controlled by the gate voltage) that receives the output of the differential amplifier 204. By virtue of this feedback circuit, control is exercised in such a manner that the bottom voltage VRB3 of reference voltages actually output from the reference circuit will agree with the voltage VRB2. The operating principle is similar to that of the differential amplifier 203 and P-channel MOS transistor 205.

Since the loads of the differential amplifiers 203, 204 are the gate capacitors of the transistors 205 and 206, respectively, it is unnecessary to enlarge the driving capability of the differential amplifiers 203 and 204.

Further, since the replica buffer circuits 201 and 202 need only have a DC characteristic equivalent to the DC characteristic of the buffer circuit 103 (FIG. 2) of the track-and-hold circuit, the size of the replica buffer circuits may be smaller than that of the buffer circuit 103 (FIG. 2) of the track-and-hold circuit. In this embodiment, the replica buffer circuits 201 and 202 have a size that is one-tenth that of the buffer circuit 103 (FIG. 2) of the track-and-hold circuit, although this does not impose any particular limitation.

In the illustrated embodiment, the replica buffer circuit 201, differential amplifier 203 and P-channel MOS transistor 205 on the side of the reference top potential constitute one set, and the replica buffer circuit 202, differential amplifier 204 and N-channel MOS transistor 206 on the side of the reference bottom potential constitute another set. It should be noted, however, that the present invention also covers an implementation having only one of either of these sets.

In accordance with this embodiment, replicas of the buffer circuit in the track-and-hold circuit are used as the buffers 201 and 202 of the reference circuit. As a result, gain error and offset error of the buffer circuit in the track-and-hold circuit are reproduced by the buffers 201 and 202 of the reference circuit and are reflected in the top voltage VRT3 and bottom voltage VRB3 of the reference voltages that are actually output from the reference circuit. Consequently, even if the signal that is supplied to the comparator circuit 30 (FIG. 1) from the track-and-hold circuit 10 (FIG. 1) contains an error, this error is cancelled in the comparator circuit by the output from the reference circuit 20 (FIG. 1).

Figure 4:
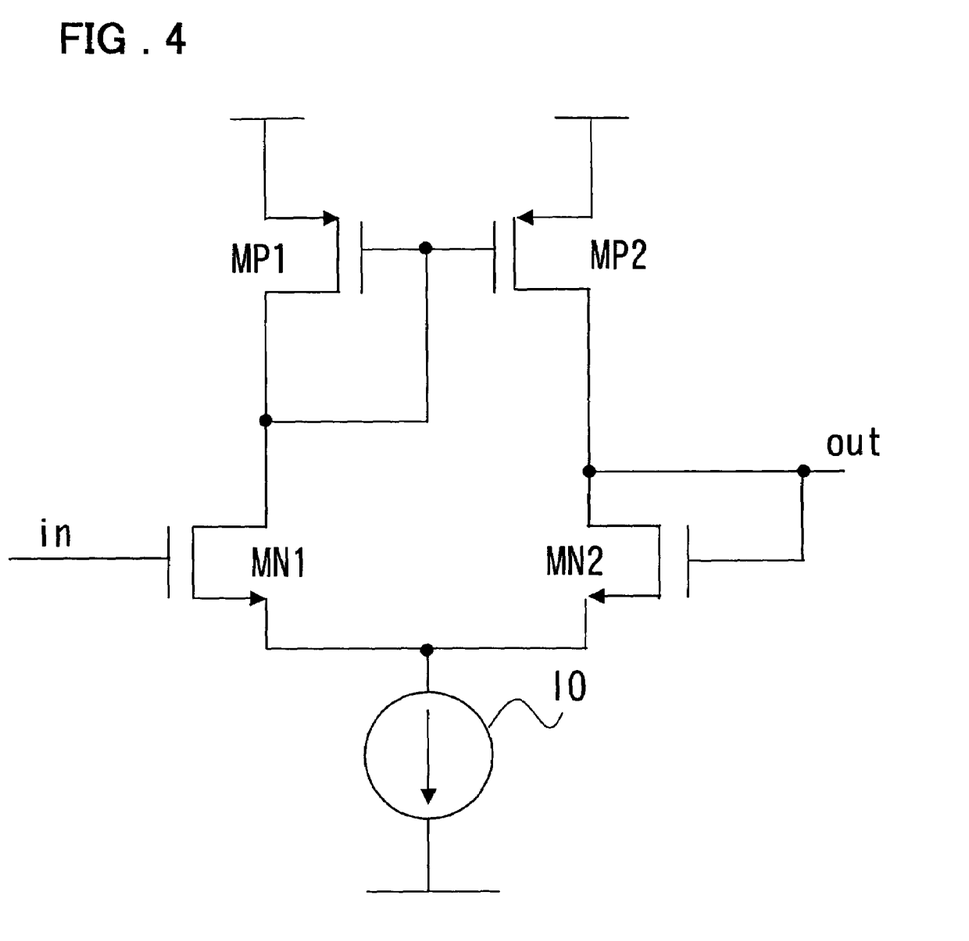
FIG. 4 is a diagram illustrating the structure of a buffer circuit in FIG. 2.
Figure 5:
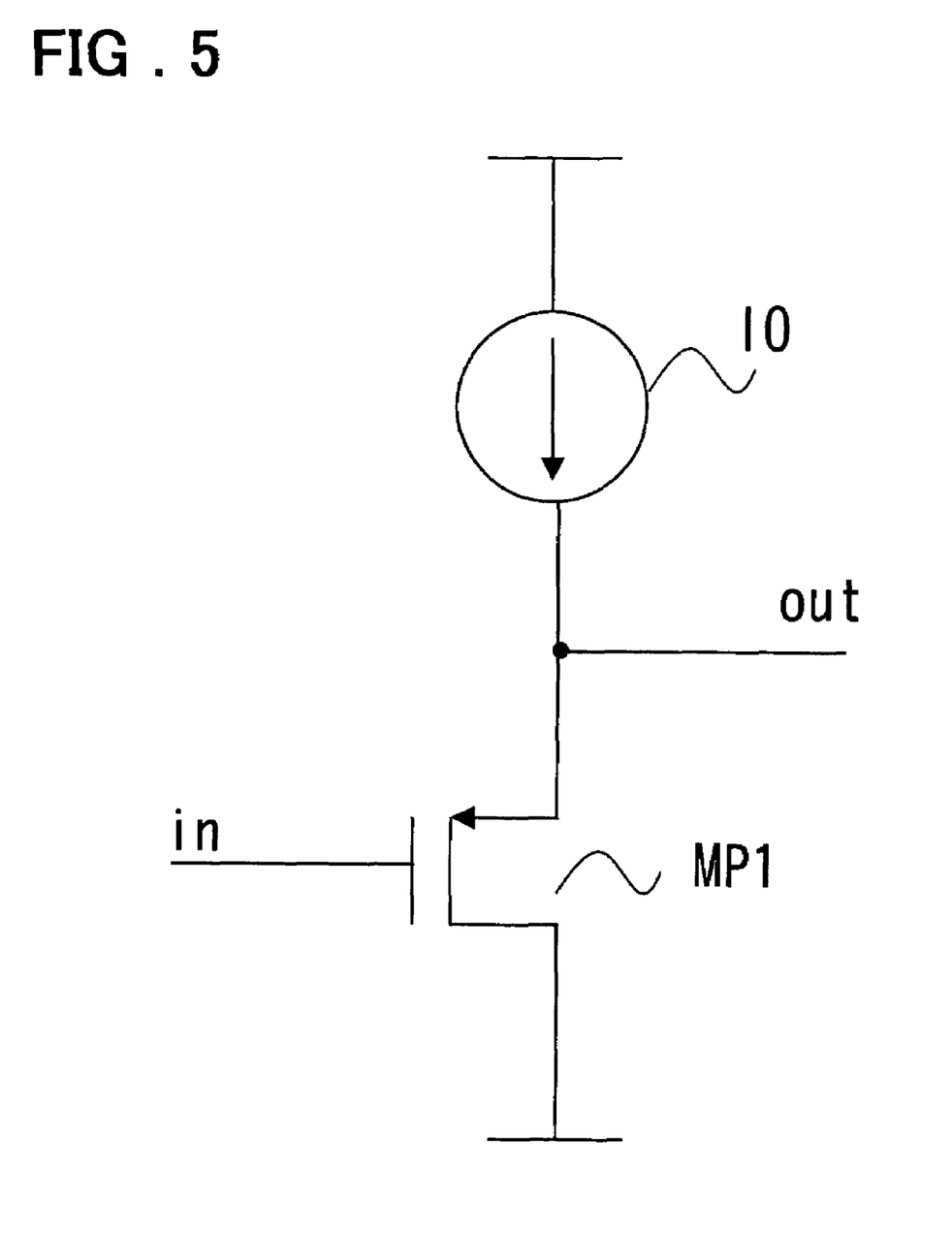
FIG. 5 is a diagram illustrating another structure of a buffer circuit in FIG. 2.

FIG. 4 is a diagram illustrating an example of the configuration of the buffer circuit 103 (FIG. 2) in the track-and-hold circuit, and FIG. 5 is a diagram illustrating an example of the configuration of the replica buffer circuits 201 and 202 (FIG. 3) in the reference circuit. More specifically, FIG. 4 illustrates a buffer circuit in which a voltage follower is constructed using a differential circuit having a differential pair (MN1, MN2) whose sources are connected together and which is driven by a constant-current source I0, and a load circuit (MP1, MP2) composed by a current mirrors. In a case where the buffer circuit 103 (FIG. 2) of the track-and-hold circuit is constituted by a voltage follower, the replica buffer circuits 201 and 202 (FIG. 3) will also be constituted by voltage followers having the identical characteristic. As a result, gain and offset errors in the buffer circuit of the track-and-hold circuit will be of substantially the same phase as error in the replica buffer circuits 201 and 202 (FIG. 3) and will be cancelled out in the comparators.

FIG. 5 illustrates a buffer circuit constituted by a source follower comprising a P-channel MOS transistor MP1 connected between the output OUT and ground. The present invention is such that in a case where buffer circuit 103 (FIG. 2) of the track-and-hold circuit is constituted by a source follower, the replica buffer circuits 201 and 202 (FIG. 3) also are constituted by source followers having the identical characteristic. As a result, the input signal and offset error of each of the comparison reference voltages supplied to the comparators are supplied to the comparators essentially as in-phase signals and therefore error is cancelled out.

Figure 6:
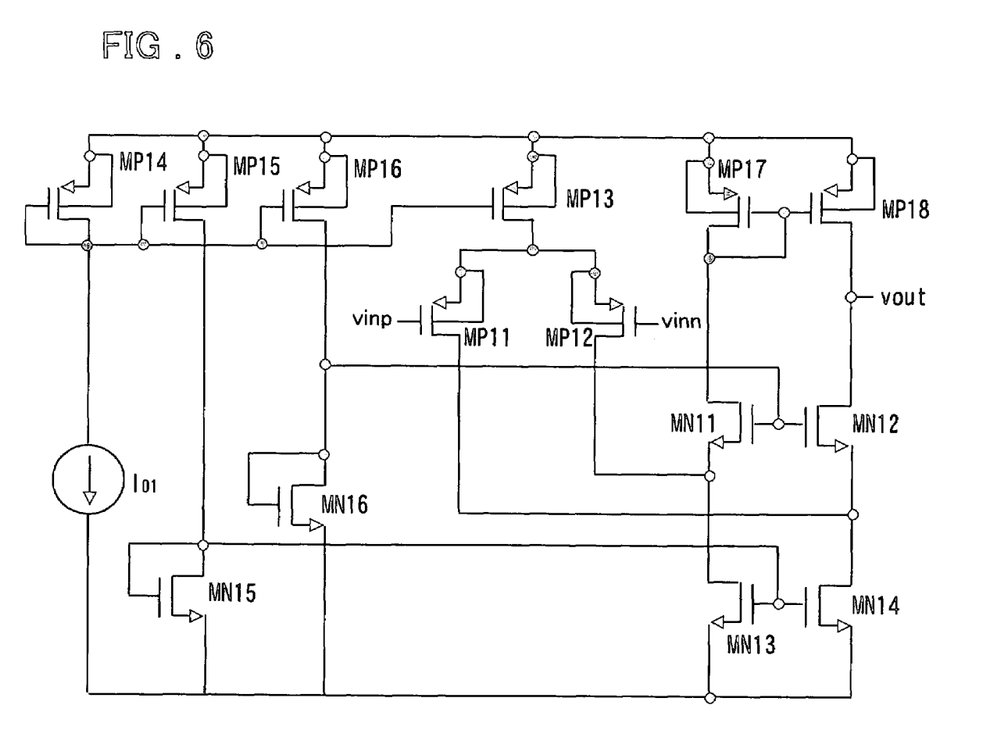
FIG. 6 is a diagram illustrating the structure of an amplifier circuit in FIG. 3.
Figure 7:
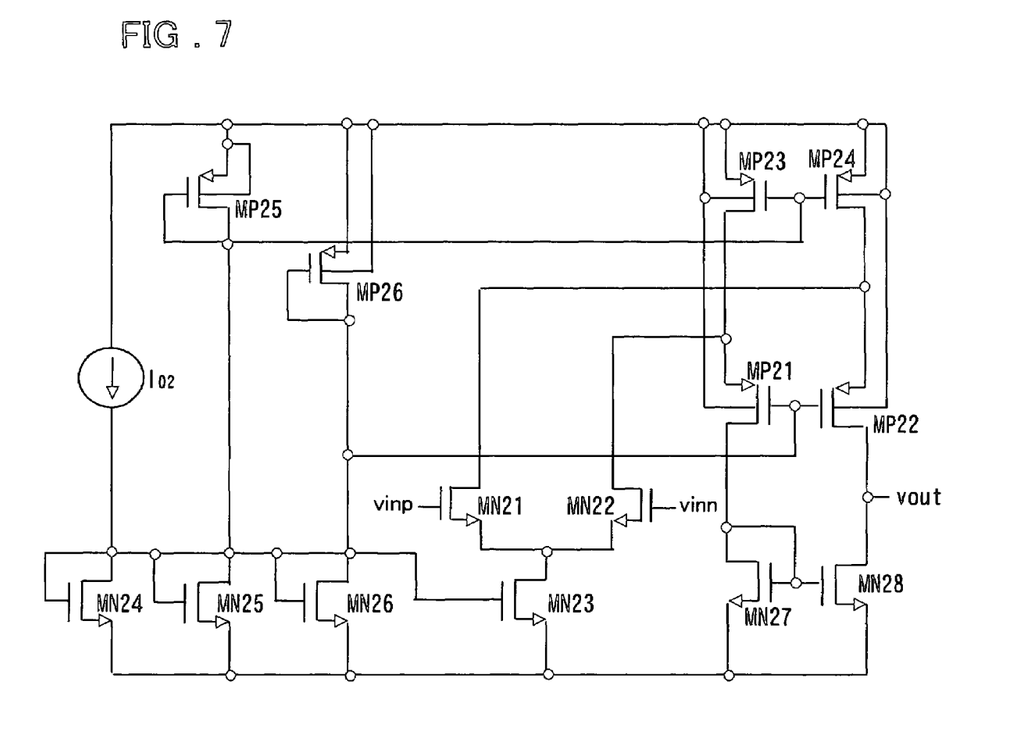
FIG. 7 is a diagram illustrating the structure of an amplifier circuit in FIG. 3.

FIGS. 6 and 7 illustrate examples of the configuration of the differential amplifiers 203 and 204 in FIG. 3. In this embodiment, folded-cascade-type amplifiers are used as the differential amplifiers 203 and 204 in FIG. 3, although this does not impose any particular limitation. It should be noted that FIGS. 6 and 7 differ only in the polarities of the differential amplifier circuits and are identical in terms of their basic structure. In FIG. 6, P-channel MOS transistors MP11, MP12 having their sources tied together and their gates connected to differential input terminals vinp and vinn, respectively, constitute a differential pair. A P-channel MOS transistor MP13 is a constant-current source of the differential pair. N-channel MOS transistors MN11 to MN14 connected to the output of the differential pair and P-channel MOS transistors MP17 and MP18 constitute a folded cascade circuit. N-channel MOS transistors MN15 and MN16 are bias circuits, and P-channel MOS transistors MP14, MP15 and MP16 constitutes a current mirror. The constant current of a constant-current source I01 is folded by the current mirror (MP14, MP15, MP16, MP13), a constant current is applied to the differential pair (MP11, MP12) and flows into the transistors MN15 and MN16, and the common gate of the transistors MN13 and MN14 and common gate of the transistors MN11 and MN12 are biased by the drain-node voltages of the transistors MN15 and MN16, respectively. A voltage that is the result of amplifying the difference voltage between the differential input terminals vinp and vinn is output from vout (the node at which the drains of transistors MN12 and MP18 are connected)

As shown in FIG. 7, N-channel MOS transistors MN21 and MN22 having their sources tied together and their gates connected to differential input terminals vinp and vinn, respectively, constitute a differential pair. An N-channel MOS transistor MN23 is a constant-current source of the differential pair. P-channel MOS transistors MP21 to MP24 connected to the output of the differential pair and N-channel MOS transistors MN27 and MN28 constitute a folded cascade circuit. P-channel MOS transistors MP25 and MP26 are bias circuits, and N-channel MOS transistors MN24, MN25 and MN26 constitutes a current mirror. The constant current of a constant-current source I02 is folded by the current mirror (MN24, MN25, MN26, MN23), a constant current is applied to the differential pair (MN21, MN22) and flows into the transistors MP25 and MP26, and the common gate of the transistors MP23 and MP24 and common gate of the transistors MP21 and MP26 are biased by the drain-node voltages of the transistors MP25 and MP26, respectively. A voltage that is the result of amplifying the difference voltage between the differential input terminals vinp and vinn is output from vout (the node at which the drains of transistors MP22 and MN28 are connected). In this embodiment, folded-cascade operational amplifiers are used as the differential amplifiers 203 and 204 of FIG. 3. However, the present invention is not limited to such an implementation and it goes without saying that any differential amplifiers can be used.

Though the present invention has been described in accordance with the foregoing embodiments, the invention is not limited to this embodiment and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An analog-to-digital converter circuit comprising:
    a buffer circuit for receiving an input signal;
    a comparator for comparing an output signal from said buffer circuit with reference voltages; and
    a reference circuit for supplying the reference voltages to said comparator;
    said reference circuit including:
        a replica buffer circuit that exhibits a predetermined characteristic corresponding to that of said buffer circuit, said replica buffer circuit outputting a reference voltage relating to at least one of a top voltage and bottom voltage of reference voltages that are output from said reference circuit; and
        a control circuit for exercising control so as to reduce an error between at least one of the top voltage and bottom voltage of reference voltages that are actually output from the reference circuit, and an output voltage of said replica buffer circuit.

2. An analog-to-digital converter circuit comprising:
    a buffer circuit for receiving an input signal;
    a comparator for comparing an output signal from said buffer circuit with reference voltages; and
    a reference circuit for generating the reference voltages and applying them to said comparator;
    said reference circuit including:
        first and second voltage-dividing resistor circuits arranged in parallel between first and second voltage supply terminals, reference voltages having levels that differ from one another being extracted from taps of said first voltage-dividing resistor circuit; and
        a control circuit, receiving as an input from a prescribed tap of said second voltage-dividing resistor circuit a reference voltage corresponding to at least one of a top voltage and bottom voltage of reference voltages output by said reference circuit, for exercising control in such a manner that at least one voltage of a voltage at a first end and voltage at a second end of said first voltage-dividing resistor circuit becomes equal to said reference voltage.

3. The analog-to-digital converter according to claim 2, wherein said control circuit of said reference circuit includes a current source with a current thereof variably controlled, between the first voltage supply terminal and a first end of said first voltage-dividing resistor circuit and/or between the second voltage supply terminal and a second end of said first voltage-dividing resistor circuit.

4. The analog-to-digital converter according to claim 3, wherein said control circuit of said reference circuit includes:
    a replica buffer circuit that exhibits a predetermined characteristic corresponding to that of said buffer circuit; and
    an amplifier circuit;
    wherein said replica buffer circuit receives as an input from a prescribed tap of said second voltage-dividing resistor circuit a reference voltage corresponding to at least one of a top voltage and bottom voltage of reference voltages that are output from said reference circuit; and
    on the basis of an output voltage of said replica buffer circuit and at least one voltage of the voltage at the first end and voltage at the second end of said first voltage-dividing resistor circuit, said amplifier circuit variably controls a current value of said current source in such a manner that at least one voltage of the voltage at the first end and voltage at the second end of said first voltage-dividing resistor circuit will be equal to said reference voltage.

5. The analog-to-digital converter circuit according to claim 4, wherein said replica buffer circuit has a DC characteristic that corresponds to that of said buffer circuit.

6. The analog-to-digital converter circuit according to claim 4, wherein said replica buffer circuit has a gain error and/or offset error that corresponds to that of said buffer circuit.

7. The analog-to-digital converter circuit according to claim 4, wherein said replica buffer circuit is adapted to have a size smaller than that of said buffer circuit.

8. The analog-to-digital converter circuit according to claim 4, wherein said buffer circuit is a buffer circuit in a track-and-hold circuit;
a plurality of said comparators being provided for receiving a signal from said buffer circuit in parallel;
said plurality of comparators being supplied with respective ones of corresponding reference voltages from said reference circuit.

9. The analog-to-digital converter circuit according to claim 4, wherein said control circuit of said reference circuit includes:
a first buffer having an input end connected to a first tap of said second voltage-dividing resistor circuit;
a second buffer having an input end connected to a second tap of said second voltage-dividing resistor circuit;
a first amplifier for receiving and differentially amplifying a voltage at the first end of said first voltage-dividing resistor circuit and output voltage of said first buffer;
a second amplifier for receiving and differentially amplifying a voltage at the second end of said first voltage-dividing resistor circuit and output voltage of said second buffer;
a first transistor connected between the first voltage supply terminal and the first end of said first voltage-dividing resistor circuit and having a control terminal connected to an output of said first amplifier; and
a second transistor connected between the second voltage supply terminal and the second end of said first voltage-dividing resistor circuit and having a control terminal connected to an output of said second amplifier;
said first and second buffers each constituting said replica buffer circuit; and
reference voltages being supplied to corresponding comparators from the first and second ends of said first voltage-dividing resistor circuit and from prescribed taps among taps of resistors connected between said first and second ends.

10. A reference circuit for generating reference voltages, comprising:
first and second voltage-dividing resistor circuits arranged in parallel between first and second voltage supply terminals, reference voltages having levels that differ from one another being extracted from respective taps of said first voltage-dividing resistor circuit; and
a control circuit, receiving as an input from a prescribed tap of said second voltage-dividing resistor circuit a reference voltage corresponding to at least one of a top voltage and bottom voltage of reference voltages that are output by said reference circuit, for exercising control in such a manner that at least one voltage of a voltage at a first end and voltage at a second end of said first voltage-dividing resistor circuit will be equal to said reference voltage.

11. The reference circuit according to claim 10, wherein said control circuit includes a current source with a current variably controlled, between the first voltage supply terminal and a first end of said first voltage-dividing resistor circuit and/or between the second voltage supply terminal and a second end of said first voltage-dividing resistor circuit.

12. The reference circuit according to claim 11, wherein said control circuit includes:
a buffer circuit; and
an amplifier circuit;
wherein said buffer circuit receives as an input from a prescribed tap of said second voltage-dividing resistor circuit a reference voltage corresponding to at least one of a top voltage and bottom voltage of reference voltages that are output from said reference circuit; and
on the basis of an output voltage of said buffer circuit and at least one voltage of the voltage at the first end and voltage at the second end of said first voltage-dividing resistor circuit, said amplifier circuit variably controls a current value of said current source in such a manner that at least one voltage of the voltage at the first end and voltage at the second end of said first voltage-dividing resistor circuit will be equal to said reference voltage.

13. The reference circuit according to claim 10, wherein said control circuit includes:
a first buffer having an input end connected to a first output end of said second voltage-dividing resistor circuit;
a second buffer having an input end connected to a second output end of said second voltage-dividing resistor circuit;
a first amplifier for receiving and differentially amplifying a voltage at the first end of said first voltage-dividing resistor circuit and output voltage of said first buffer;
a second amplifier for receiving and differentially amplifying a voltage at the second end of said first voltage-dividing resistor circuit and output voltage of said second buffer;
a first transistor connected between the first voltage supply terminal and the first end of said first voltage-dividing resistor circuit and having a control terminal connected to an output of said first amplifier; and
a second transistor connected between the second voltage supply terminal and the second end of said first voltage-dividing resistor circuit and having a control terminal connected to an output of said second amplifier;
reference voltages being extracted from the first and second ends of said first voltage-dividing resistor circuit and from at least one tap among taps of resistors connected between said first and second ends.

* * * * *